United States Patent [19]

Shimazaki et al.

[11] Patent Number: 4,700,138

[45] Date of Patent: Oct. 13, 1987

[54] AUTOMATIC GAIN CONTROL APPARATUS FOR NMR IMAGING SYSTEM

[75] Inventors: Toru Shimazaki; Yoshihiko Watanabe; Hideto Iwaoka, all of Tokyo, Japan

[73] Assignees: Yokogawa Electric Corporation; Yokogawa Medical Systems, Limited, both of Tokyo, Japan

[21] Appl. No.: 873,390

[22] Filed: Jun. 12, 1986

[30] Foreign Application Priority Data

Jun. 28, 1985 [JP] Japan .................................. 60-141890

[51] Int. Cl.$^4$ ............................................. G01R 33/20
[52] U.S. Cl. ........................................ 324/322; 324/313
[58] Field of Search ................. 324/322, 318, 309, 307

[56] References Cited

U.S. PATENT DOCUMENTS 4,070,708  1/1978  Smallcombe et al. .............. 324/307

FOREIGN PATENT DOCUMENTS 5227691  3/1977  Japan ................................. 324/322
2021780  12/1979  United Kingdom ............... 324/322

Primary Examiner—Stewart J. Levy
Assistant Examiner—Louis M. Arana
Attorney, Agent, or Firm—Moonray Kojima

[57] ABSTRACT

In measuring a number of echo signal, which normally attenuate chronologically, in a single pulse sequence, such as in multi-echo method or a multi-slice method, each echo signal is received and suitably amplified by a reception amplifier having predetermined levels of gain for different time periods during which the successive echo signals are processed such that the echo signals received at a data collection unit are all of substantially the same amplitude regardless of where they appear in the time sequence. The predetermined levels of gains are obtained by false scanning prior to actual image scanning and calculation and storing in a memory. As a result, the echo signals can be received within a dynamic range which is smaller than using the conventional system.

2 Claims, 4 Drawing Figures

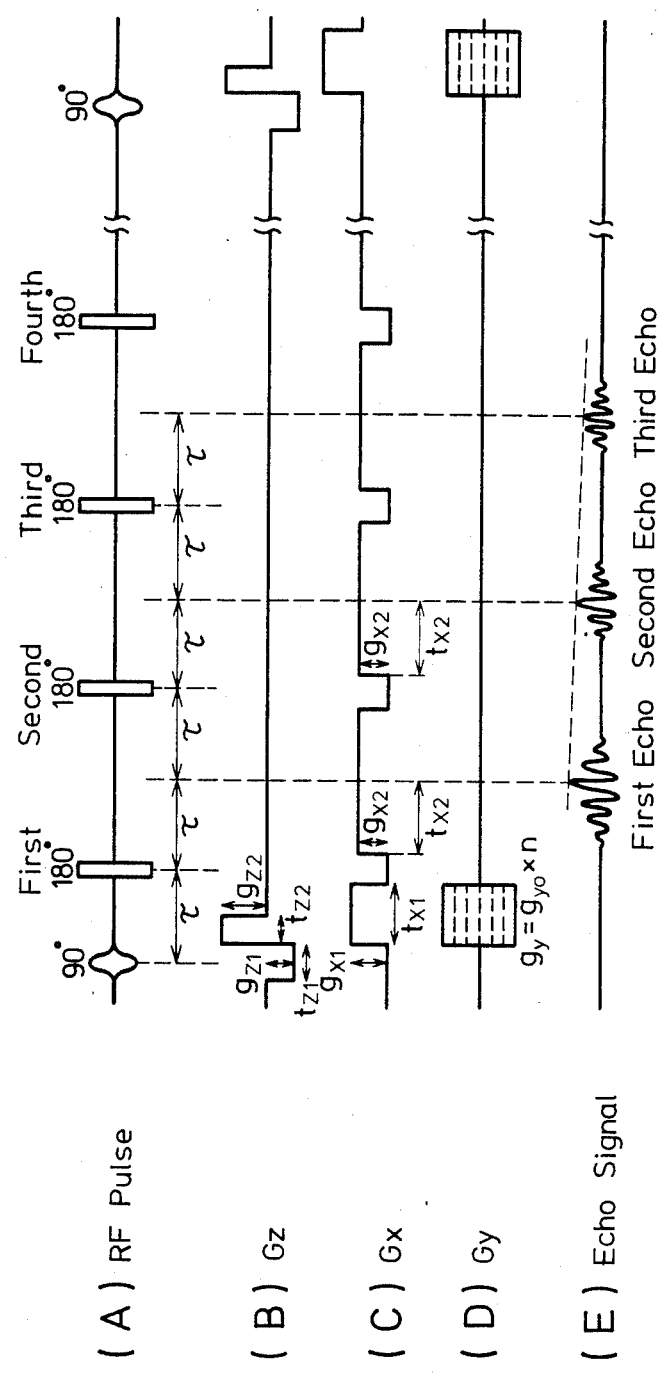

AUTOMATIC GAIN CONTROL APPARATUS FOR NMR IMAGING SYSTEM

BACKGROUND OF INVENTION

1. Field of the Invention

This invention relates to an automatic gain control apparatus in an NMR imaging system.

2. Description of Prior Art

NMR (nuclear magnetic resonance) imaging systems are known. One method of measuring an NMR signal is the multi-echo method. An example of the multi-echo method is shown in FIG. 4, which comprises lines (A)-(E), and which depicts the pulse sequence used in the multi-echo method. A two-dimensional multi-echo method involves the following steps. As shown in FIG. 4, a static field is imparted to the body or object being examined. Concurrently a Z gradient magnetic field $G_Z-$ (line B) is imparted to the body. At the same time, a 90° RF pulse (line A) is impressed on the body for selective excitation. Then, gradient magnetic field $G_Z+$ (line B) is impressed for only a period of time $t_{Z2}$. At the same time, an X gradient magnetic field $G_X$ (line C) and a Y gradient magnetic Field $G_Y$ (line D) are impressed. In this case, $G_Z$ is equal to $$g_{Z1} \cdot t_{Z1} = g_{Z2} \cdot t_{Z2}$$

wherein,
$g_{Z1}$ is the strength of $G_Z-$
$t_{Z1}$ is the impressing time of $G_{Z1}$
$g_{Z2}$ is the strength of $G_Z+$
$t_{Z2}$ is the impressing time of $G_{Z2}$ and
$G_Y$ is equal to $$G_{Y_0} X n$$

wherein n is the view number, which varies as follows $-N, -N, +1, \ldots -1, 0, 1, 2, \ldots +N$.

After time $\tau$ (line A) from the impression of the 90° pulse, a 180° pulse is impressed for turning spins in dispersion through an angle of 180°. At that time, all gradient magnetic fields are removed.

Subsequently, X gradient magnetic field $G_X$ is impressed (line C). A first echo signal (line E) is generated, which becomes maximum after time $\tau$ from the point of impression of the 180° pulse. In this case, in the impression of the X gradient magnetic field, $$g_{X1}19 \, t_{X1} = g_{X2} \cdot t_{X2}$$

wherein
$g_{X1}$ and $g_{X2}$ are the strength of $G_X$
$t_{X1}$ is the impressing time of $G_{X1}$
$t_{X2}$ is the impressing time of $G_{X2}$.

In the next step, after time $\tau$ from the starting point, which is at the time point when the first echo signal is peaked, a second 180° pulse (line A) is impressed. During the observation of the first echo signal, an X gradient magnetic field (line C) is continuously impressed. Then, after time $\tau$ from the impression of the second 180° pulse, a third 180° pulse (line A) is impressed. In this case, the impression of the X gradient magnetic field takes place after termination of the second 180° pulse at the strength of magnetic field of $g_{X2}$ for a period of time $t_{X2}$ (line C).

Similarly, to the effect of the first 180° pulse, the second 180° pulse acts to invert the spin to produce the second echo signal (line E). Thus in the same manner, using the third 180° pulse, etc, and $g_{xn}$ magnetic field, a plurality of echo signals (third, etc.) are obtained with respect to the view.

As for other views, a multiplicity of echoes can be observed by the same operation, with gradual varying of the strength of the Y gradient magnetic field $G_Y$. Thus, a multiplicity of echo signals are produced by impressing a 180° pulse for each view. These echo signals are then observed.

However, in the multi-echo method, because analog to digital conversion (called A/D conversion) of echo signals (see phantom line (dotted line) of FIG. 4, line E) there is a tendency for the resultant echo signals to attenuate chronologically. Thus, a wide dynamic range is required of the A/D converter to make the A/D conversion. Moreover, since reconstitution of the image takes place for each echo signal, the image of the first echo would be relatively bright (that is the signal strength is great), but the image of the second and subsequent echoes would be relatively increasingly darker. Thus, the images of the successive echoes become more difficult to observe on the same display.

One solution to the problem of decreasing quality of the successive images is to control the brightness adjustment of the display by dividing the region. But, this solution is unsatisfactory because it requires repeated and continuous manipulation of the controls.

Another solution is to compress the data logarithmically to provide a wide dynamic range. But, this solution is also unsatisfactory since the imaging system would be unduly complex.

SUMMARY OF THE INVENTION.

Accordingly, an object of the invention is to overcome the aforementioned and other deficiencies and disadvantages of the prior art.

Another object is to provide an NMR imaging system wherein each image is observed at substantially the same level of quality by automatically controlling the gain of a reception amplifier which receives the echo signal so that the gain would increase for each succeeding echo signal received. In this manner, the required dynamic range of the A/D conversion is reduced, and the cost and imaging process are reduced and simplified.

The foregoing and other objects are attained by the invention which encompasses an image scanning apparatus wherein the gain of the reception amplifier is controlled selectively so as to be at a predetermined gain for each received echo signal, with the predetermined gain being obtained by data and calculation of data obtained by false scanning for each measuring period for the respective echo signal.

DESCRIPTION OF DRAWINGS

FIG. 4, comprising lines (A)-(E), is a time chart depicting pulse sequences in a multi-echo method.

DETAILED DESCRIPTION OF PREFERRED EMBODIMENTS

Figure 1:
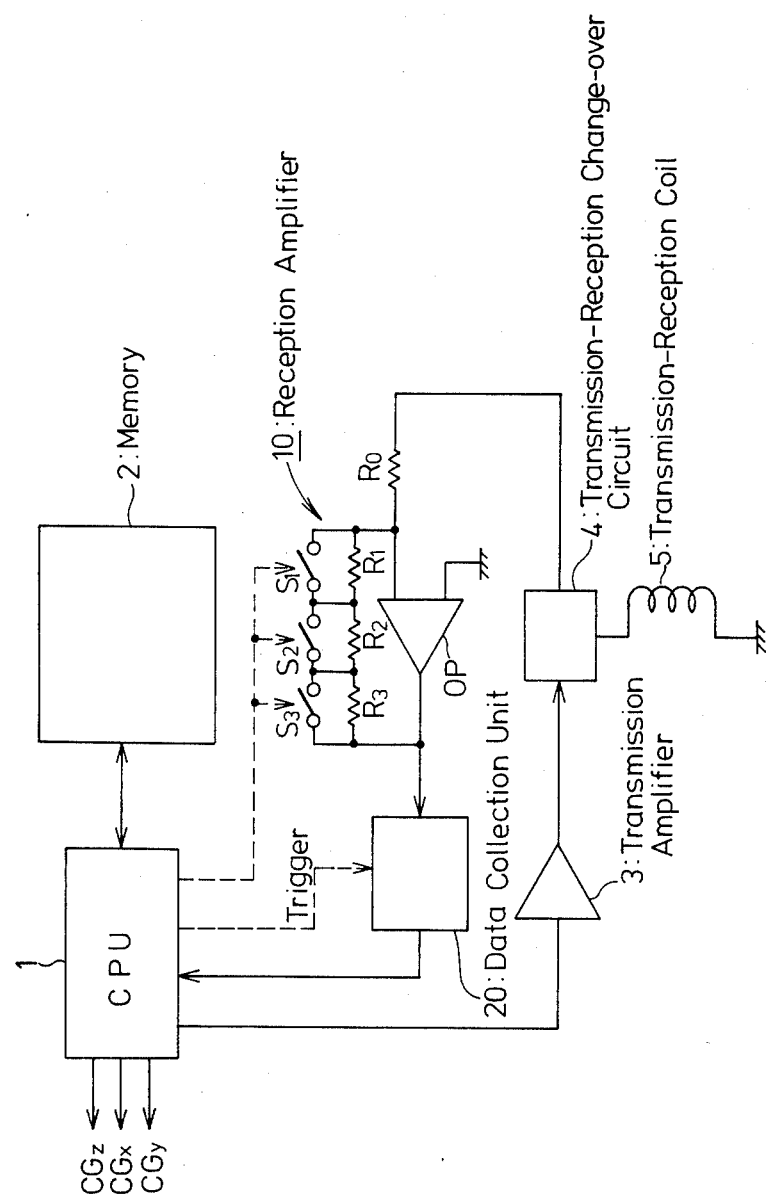
FIG. 1 is a diagrammatic view depicting an illustrative embodiment of the invention.

Turning now to FIG. 1, there is depicted an automatic gain control apparatus, for use in an NMR imaging system, comprising a central processing unit 1 (called "CPU"), memory 2, transmission amplifier 3, transmission-reception change over circuit 4, transmission-reception coil 5, reception amplifier 10, and data collection unit 20.

CPU 1 functions as a sequencer and controls the impression (i.e. the application to suitable coils of various signals to produce magnetic fields which are applied to the object or body being examined) of gradient magnetic fields and the RF pulses. Specifically, control signals $CG_Z$, $CG_X$, $CG_Y$ for controlling (i.e. controlling the magnetic strength and the period of time of impression) gradient magnetic fields $G_Z$, $G_X$, $G_Y$ are transmitted, and concurrently, a 90° RF pulse signal and a 180° RF pulse signal are produced. Transmission amplifier 3 amplifies the individual pulse signal to a desired value and adds the same pulse signal to transmission-reception coil 5 via transmission-reception change over circuit 4, to thereby actuate transmission-reception coil 5. This transmission-reception coil 5 serves to receive an echo signal which is then sent to reception amplifier 10.

The gain of amplifier 10 is controlled by an external signal outputted from CPU 1. For example, as shown in FIG. 1, amplifier 10 includes an amplifier OP and a plurality of return resistors $R_1$, $R_2$, $R_3$ connected in series, and switches $S_1$, $S_2$, $S_3$ connected in parallel to resistors $R_1$, $R_2$, $R_3$, as depicted. Switches $S_1$, $S_2$, $S_3$ may be of the ON-OFF type.

Data collection unit 20 is actuated by a trigger signal from CPU 1 for reading an echo signal given via amplifier 10 after digital conversion. The output of unit 20 is sent to CPU 1 whereat a reconstituted image is obtained by utilizing the data. In CPU 1 raw data and image data after reconstitution are stored in memory 2 as desired. The reconstituted image thus obtained is displayed on a display (not shown) under control of CPU 1.

Figure 2:
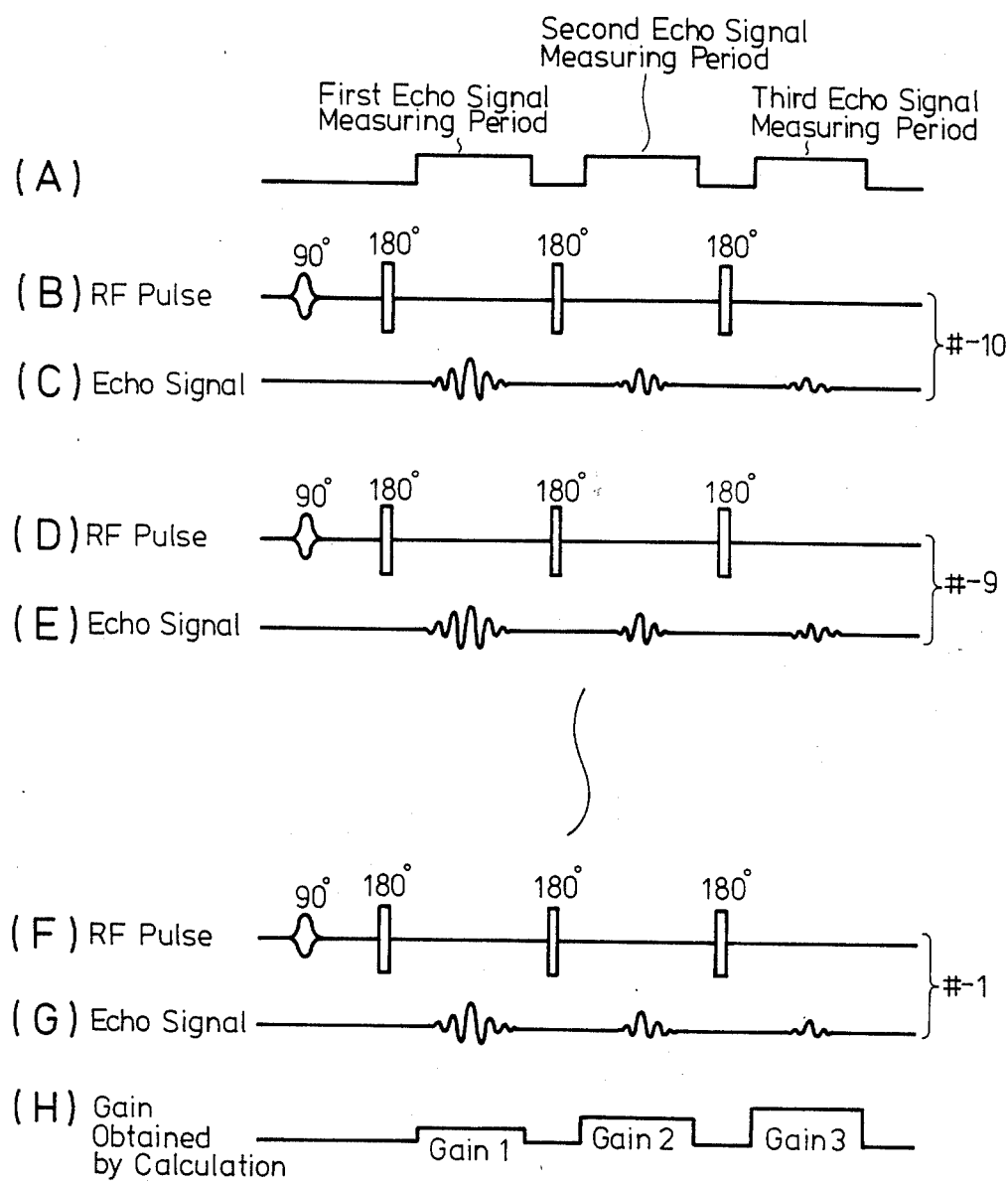
FIG. 2, comprising lines (A)-(H), is a time chart depicting a mode of operation of the invention.
Figure 3:
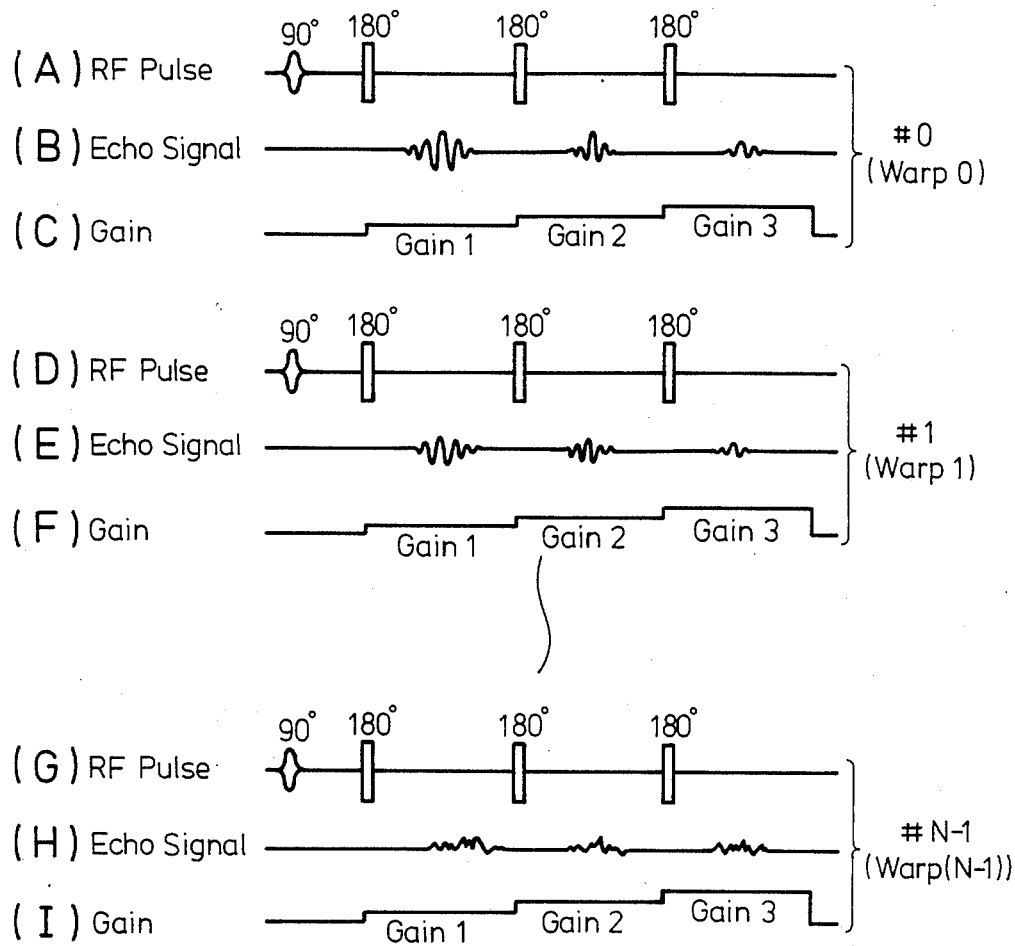
FIG. 3, comprising lines (A)-(I), is a time chart depicting modes of operation of the invention.

The modes of operation will now be described in connection with the time charts of FIGS. 2, 3. To control the gain of the amplifier 10, the invention utilizes a special pulse sequence so as to obtain a desired amount of gain in amplifier 10, by executing false scanning, preferably a plurality of times, prior to executing actual image scanning. This false scanning, as shown in FIG. 2, for example, produces each echo signal by a pulse sequence similar to the image scanning, with zero warp amount (i.e. encoded amount), and measures this echo signal. The gain of the amplifier at that time is predetermined to be a suitable level which would not cause an over range in measuring the echo signal.

The echo signals within one repeat time cycle are measured individually and are then placed successively in the memory 2. The echo signals thus measured are not used as data to reconstitute the image.

After this false scanning has been repeated a number of times, for example ten times, and such echo signals have been stored in memory 2, a mean value for each of the first, second and third echo signals is obtained by CPU 1. Then, the most suitable level of gain (or controlled gain) of the amplifier 10 for each echo signal measuring period (see line A of FIG. 2) is obtained by calculation based on the mean value of the relevant echo signal. More specifically, this controlled gain is restricted to a determinable gain of amplifier 10. Assuming, for example, that gains 1;2,3 (see FIG. 2, line H) are the most suitable gains obtained when measuring the first, second and third echo signals, respectively, as shown in FIG. 2. Then, when gain 1 (line H) is to be obtained, switch $S_1$ (FIG. 1) is turned OFF, with switches $S_2$, $S_3$ being turned ON. When gain 2 (line H) is to be obtained, switch $S_2$ is turned OFF, with switches $S_1$, $S_3$ being turned ON. When gain 3 is to be obtained, switch $S_3$ is turned OFF, with switches $S_2$, $S_1$ being turned ON. Using the multi-echo reception, gain 1 is smaller and gain 3 is larger, in accordance with the invention.

After the gain in each measuring period has thus been determined, image scanning for reconstitution of image is executed. In the image scanning, echo signals are measured by scanning using a pulse sequence similar to FIG. 4, while varying the warp amount as shown in FIG. 3. At that time, reception amplifier 10 (comprising switches, resistors and amplifer) has switches $S_1$, $S_2$, $S_3$ selectively operated to selectively and dynamically provide suitable levels of gains 1, 2, 3 in the first, second and third period of echo measurement, respectively, in each sequence and under the control of CPU 1. Consequently, each echo signal is received and after suitably changing the level of gain of amplifier 10, sent by amplifier 10 at a desired level, preferably all being substantially the same anplitude, to data collection unit 20. For example, as shown in FIG. 3, the gain of amplifier 10 is made larger for succeeding echo signals so that the amplified signals sent to unit 20 are substantially the same, and the displayed images will be substantially the same in quality. In lines (A)-(I), the gains are selectively changed according to the different warp.

Since an absolute value of the thus obtained data is not precisely known, it is inconvenient to find the real value when the absolute value varies from one image to another. To handle this problem, it is preferable to store in a memory the relation between the echo signal and the gain so that comparison in absolute values can be achieved. For example, it is preferable to add the value of the gain to every two data of the echo signal.

As mentioned above, since the received signals sent to the data collection unit 20 for all echo signals are substantially uniform, it is possible to reduce and limit the dynamic range of the A/D converter used in the NMR system. Furthermore, a uniform brightness of every image can be achieved without any special reconstituting process.

As would be apparent to the worker skilled in the art, the various time periods $\tau$ and $t_{xn}$, amplitudes of signals, e.g. RF pulse, $G_Z$, $G_X$, $G_Y$, and amplitudes and duration of gains can be readily determined and established for the conditions desired. For the time periods and signal amplitudes given, to obtain uniform echo signal output from amplifier 10, the amplitudes and duration of gain obtained by calculation, as discussed above, are as shown in FIG. 2. With various echo signal warps, the gains are selectively adjusted as to levels, as shown in FIG. 3, lines (C), (F) and (I).

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. In an NMR imaging system for reconstituting an image of an object being examined by measuring a plurality of echo signals in one time cycle using a multi-echo method or a multi-slice method, an automatic gain control apparatus comprising measuring means having a gain variable reception amplifier for measuring independently the echo signals in one time cycle;

control means having a sequence function for executing false scanning using same scan parameters as that of an actual image scanning prior to executing actual image scanning, a function of imparting a control signal to said reception amplifier to control its gain, and a function of obtaining a desired level of gain of said reception amplifier from an echo signal resulting from said false scanning; and memory means for memorizing said gain, wherein during image scanning under the control of said control means, the level of gain of said reception amplifier is selectively set for each echo signal measuring time period so as to be the level of gain obtained for that time period by the false scanning step, such that the amplified successive echo signals are substantially the same in amplitude regardless of their place in the time frame.

2. The system of claim 1, wherein said reception amplifier comprises an operating amplifier, and a series connected plurality of resistors connected across said operating amplifier, and a plurality of switches connected across said resistors.

* * * * *